United States Patent [19]
Candy

[11] Patent Number: 5,892,398
[45] Date of Patent: Apr. 6, 1999

US005892398A

[54] AMPLIFIER HAVING ULTRA-LOW DISTORTION

[75] Inventor: Bruce Halcro Candy, Basket Range, Australia

[73] Assignee: BHC Consulting Pty Ltd, Australia

[21] Appl. No.: 765,866

[22] PCT Filed: Jul. 13, 1996

[86] PCT No.: PCT/AU95/00424

§ 371 Date: Jan. 10, 1997

§ 102(e) Date: Jan. 10, 1997

[87] PCT Pub. No.: WO96/02974

PCT Pub. Date: Feb. 1, 1996

[30] Foreign Application Priority Data

Jul. 13, 1994 [AU] Australia ................... PM6784
Jul. 18, 1994 [AU] Australia ................... PM6875

[51] Int. Cl.$^6$ ........................................ H03F 1/32
[52] U.S. Cl. .................... 330/156; 330/255; 330/204; 330/267
[58] Field of Search .................... 330/156, 255, 330/264, 265, 267, 271, 273

[56] References Cited

U.S. PATENT DOCUMENTS 3,995,228  11/1976  Pass ................................ 330/255 X
4,467,288   8/1984  Strickland .
4,476,442  10/1984  Iwamatsu .

FOREIGN PATENT DOCUMENTS 0 217 431  4/1987  European Pat. Off. .
2 261 785  5/1993  United Kingdom .

Primary Examiner—James B. Mullins
Attorney, Agent, or Firm—Finnegan, Henderson, Farabow, Garrett & Dunner, L.L.P.

[57] ABSTRACT

This invention is for an improvement in amplifiers resulting in ultra low distortion. It relates to amplifiers consisting of three stages, an input stage which amplifies an input signal and provides a first signal to an intermediate stage which amplifies the first signal and provides a second signal to an output stage which amplifies that second signal and provides an amplifier output signal, the amplifier further including a power supply to provide power to the three stages and wherein the low distortion is achieved by the output stage including output transistors connected to provide the amplifier output signal and further including an error correction means that comprises an input buffer means, an adding means, a subtracting means and a voltage follower buffer means wherein the adding means sums the second signal with a difference signal to produce an output sum signal the said output sum signal fed to the voltage follower buffer means which then provides a buffered output sum signal, which is then fed to the inputs of the output transistors and to the subtracting means, the amplifier output signal is also fed to the subtracting means which is adapted to subtract the amplifier output signal from the buffered output sum signal to produce a difference signal and a first bootstrap power supply to provide power to the error correction means, the bootstrap power supply closely tracking the output signal by means of bootstrapping.

20 Claims, 2 Drawing Sheets

AMPLIFIER HAVING ULTRA-LOW DISTORTION

TECHNICAL FIELD

This invention relates to amplifiers and in particular relates to an arrangement of an amplifier and to a method of amplification which provides improved accuracy of the amplification.

BACKGROUND ART

Most amplifiers consist of three stages:
1. An input stage, normally a differential voltage to current converter stage, in which current variations are relatively small;
2. followed by an intermediate stage whose output may produce large voltage variations and about which the amplifier's dominant pole is often formed;
3. which is then followed by an output stage most often in the form of a voltage follower.

All three stages produce distortion which affects the signal to be amplified, the output stage usually being the worst.

Throughout this specification the following descriptions are used:

The input signal to the amplifier is termed an "amplifier input signal" and is supplied to an "amplifier input", which is used to denote the input of an "input stage" adapted to amplify the amplifier input signal and to provide a "first signal."

The first signal is fed to a next stage, termed an "intermediate stage" which is adapted to amplify the said first signal and further adapted to provide a "second signal." The second signal is fed to an input of an "output stage" adapted to amplify the said second signal and further adapted to provide an "amplifier output signal" to an "amplifier output."

A "power supply means" is adapted to provide power to the input stage, the intermediate stage and the output stage.

A review of the current state of the art in low distortion has been given by D. Self in a series of articles in "Electronic World+Wireless World" from August 1993 to January 1994. In these articles distortions in each of the three stages as set out above are described and current best methods for achieving low distortion are discussed.

The D. Self articles discussed above recommended that the first stage is a differential voltage to current converter, followed by an intermediate stage about which the dominant amplifier pole is formed. This intermediate stage is a cascade amplifier feeding a constant current source so that distortion from the well known "Early effect" is avoided. Buffer transistors are inserted between the output transistors and the intermediate stage. The lowest distortion is achieved by using a symmetrical complementary bi-polar transistors in the output stage, where the one half is a driver-npn-cum-power-pnp pair configured with a large measure of local negative feedback and the other half is similarly a driver-pnp-cum-power-npn pair configured with a large measure of local negative feedback. The Self articles also recommends and teach certain circuit layouts so that spurious sources of distortion causing mechanisms may be avoided.

The lowest combination of distortion as taught by those articles gives a total harmonic distortion of about 10 parts per million (10 ppm) at 1 kHz and a little over 100 ppm at 20 kHz. However this was measured in a amplifier of very modest power, namely 10 watts. These figures are thought to be consistent with the best state-of-the-art low distortion amplifiers presently commercially available and possible from currently known techniques.

DISCLOSURE OF THE INVENTION

In accord with the teaching of this invention an amplifier has been built that achieves significantly less distortion than hitherto known and in one preferred embodiment achieves less than 1 ppm distortion at 20 kHz and an unmeasurable rating by current instruments at 1 kHz, but which is certainly less than 0.3 ppm and probably less than 0.1 ppm. This has also been achieved at high powers (up to 400 watts) as compared with the powers used by D. Self, and using a B-class MOSFET output stage. Both of these factors normally result in higher distortions compared to that attainable at lower powers, and especially with the bipolar output transistors, or A-class amplifiers regardless of the output devices used.

This invention achieves this by teaching a different topography in all three stages to achieve an approximately two orders of magnitude improvement.

Therefore in one form of the invention there is proposed an electronic amplifier apparatus comprising of an input stage, to which an amplifier input signal is applied and which is adapted to amplify the amplifier input signal and to provide a first signal to an intermediate stage adapted to amplify the said first signal and further adapted to provide a second signal to an output stage adapted to amplify the said second signal and further adapted to provide an amplifier output signal to an amplifier output and a power supply means adapted to provide power to the input stage, the intermediate stage and the output stage, wherein the output stage including output transistors connected so as to provide the amplifier output signal and further including an error correction means comprising of an input buffer means, an adding means, a subtracting means and a voltage follower buffer means wherein, the said adding means is adapted to sum the second signal with a difference signal to produce an output sum signal, the said voltage follower buffer means is adapted to provide a buffered output sum signal when fed the output sum signal, the buffered output sum signal is fed to inputs of the output transistors and to the subtracting means, the amplifier output signal is fed to the subtracting means which is adapted to subtract the amplifier output signal from the buffered output sum signal to produce the difference signal, and a first bootstrapped power supply is adapted to provide power to the error correction means, the first bootstrapped power supply further adapted to closely track the output signal by means of bootstrapping.

Preferably all transistors in the error correction means are small signal transistors.

Preferably the second signal is also fed to a constant current source whose power is supplied by the said first bootstrapped power supply means which is further adapted to provide power to the constant current source, the constant current source containing a constant current supply transistor which is a small signal transistor.

Preferably the bootstrapped power supply means has little distortion and has local negative feedback.

Preferably the output buffered sum signal is substantially independent of temperature.

Preferably said voltage follower buffer has substantially high input impedance, low output impedance, low distortion and negative feedback localised to the said voltage follower buffer.

Preferably the said voltage follower buffer has substantially high input impedance, low output impedance, low distortion and negative feedback localised to the said voltage follower buffer.

Preferably the input stage contains a first input differential stage adapted to convert a voltage differential signal to a current signal whose amplitude is substantially linearly proportional to the said voltage differential signal, the first differential input stage containing transistors across which a potential difference is held substantially constant.

Preferably the input stage contains a first input differential stage adapted to convert a voltage differential signal to a current signal whose amplitude is substantially linearly proportional to the said voltage differential signal, the first differential input stage containing transistors across which said potential difference is held substantially constant.

Preferably the input stage contains a first input differential stage adapted to convert a voltage differential signal to a current signal whose amplitude is substantially linearly proportional to the said voltage differential signal, the first differential input stage containing transistors across which said potential difference is held substantially constant.

In a further form of the invention there is proposed a method of electronic amplification by applying an amplifier input signal to an amplifier input stage to amplify the amplifier input signal and provide a first signal, said first signal then amplified by an intermediate stage and providing a second signal, that is amplified by an output stage that provides an amplifier output signal to an amplifier output, the stages provided power by a power supply means wherein the output stage contains output transistors which provide the amplifier output signal and also contains an error correction means consisting of an input buffer means, a adding means, a subtracting means and a voltage follower buffer means wherein the adding means sums the second signal with a difference signal to produce an output sum signal, the voltage follower buffer means provides a buffered output sum signal when fed the output sum signal, the buffered output sum signal is fed to inputs of output transistors and to the subtracting means, the amplifier output signal is fed to the subtracting means which subtracts the amplifier output signal from the buffered output sum signal to produce the difference signal, and power is supplied to the error correction means by a first bootstrapped power supply which closely tracks the output signal by means of bootstrapping.

In one embodiment, the output stage contains an error correction means consisting of an input buffer means, a adding means, a subtracting means and a voltage follower buffer means. The adding means is adapted to sum the second signal with a difference signal to produce an output sum signal which is fed to. The voltage follower buffer means which provides a buffered output sum signal when fed the output sum signal. The buffered output sum signal is fed to inputs of output transistors and to the subtracting means. The amplifier output signal is fed to the subtracting means which subtracts the amplifier output signal from the buffered output sum signal to produce the difference signal. Here the "gain" of the adding means, subtracting means and voltage follower buffer means is set to unity. This topology substantially reduces the distortion arising from the output transistors which when producing the output signal intrinsically generate a non-linear error component signal (distortion).

Suppose the amplifier output signal is the buffered output sum signal plus the non-linear error component signal, then the difference signal is negative the non-linear error component signal. When this difference signal is added to the output stage input signal (the second signal), the output sum signal which equals the buffered output sum signal is the second signal minus the non-linear error component signal. Hence simple arithmetic then shows that the amplifier output signal in fact equals the second signal and hence the distortion from the output transistors is eliminated. Note this is not negative feedback, at least not in the traditional sense. Unlike negative feedback, this is a precise addition and subtraction with a unity gain and hence the poles of the transfer function in this do not significantly effect the requirements of the amplifiers dominant pole as they would in a traditional amplifier with enough local negative feedback in the output stage to reduce the output stage distortion down to the levels achievable using this error correction technique. Thus it is possible to substantially improve overall distortion by using this error correction technique rather than the use of negative feedback.

However, the above embodiment assumes that the buffers, adders and subtractors themselves produce insignificant distortion; if the conventional amplifier topology is adopted in implementing the buffering, adding and subtracting stages, namely by implementing an output stage input buffer, the intermediate stage cascade constant current "load" and voltage follower buffer, and possibly also the adder and subtracter, using the traditional medium power large signal transistors with power provided from the amplifier power supply rails, then the improvement over the prior teachings of Self and commercially available amplifiers is about an order of magnitude, not two.

In order to achieve an improvement of a factor of about two orders of magnitude, it is necessary to employ two other non-traditional changes, namely, the buffers, constant current source, added and subtracter should use transistors whose power is derived not from the amplifier supply rails, but from a bootstrapped supply which closely tracks the amplifier output signal. This then reduces the distortion generating effects in these transistor stages such as gain modulation with voltage (Early effect) and non-linear capacitance effects. Furthermore, all these transistors can be small signal types, provided that the bootstrapped supply voltages are kept reasonably small about the amplifier output signal. Compared to high voltage, especially high voltage power types (large signal devices), small signal low voltage transistors are obtainable with substantially higher gains, higher transition frequencies and lower inter-terminal capacitances. Gains vary according to collector (or drain) voltages and current. Inter-terminal capacitances vary according to inter-terminal voltages. Frequency gain cut-offs effect the degree of local and global feedback. All these distortion affecting mechanisms substantially act in the small signal, high gain, high frequency and low inter-terminal capacitance transistors' favour. Hence a substantially higher component of distortion will result from the use of high voltage (power) transistors compared to the use of the small signal types performing the same operations.

Table I illustrates these differences in typical high quality audio transistors:

TABLE I

| Parameter | Small signal type | Large signal type |
| --- | --- | --- |
| current gain | 500 | 100 |
| transition frequency | 300 MHz | 100 MHz |
| collector capacitance | 2.5 pF | 25 pF |
| break down voltage | 45 v | 250 v |
| power dissipation | 0.5 W | 20 W |

The said bootstrapped supply may be bootstrapped to the outputs of the output stage input buffers as the signal at this point is substantially the same as the amplifier output signal.

Further more, at high frequencies the input impedance of the output transistors can present a significant non-linear load to the voltage follower buffers because of the non-linear output transistor capacitances (as a function of voltage) and non-linear input currents in the case of bi-polar transistors as a function of collector current and voltage. Unless the voltage follower buffers have a low output impedance, high gain and low distortion, this non-linear load can be a significant source of distortion. In order to avoid this distortion, we have shown that a voltage follower buffer with substantial local feedback can be used without a measurable contribution to the distortion at high frequencies. Again it is advantageous if the transistors in this stage are small signal types.

There are two heat areas in a power amplifier, the temperature of the printed circuit board (PCB) mounted circuitry and the temperature of the heat sink.

It is important that both should be compensated for in basic amplifier operation. In particular, the output buffered sum signal which supplies the output transistors should be substantially independent of temperature in order to avoid changing quiescent currents in the output transistors as the temperature changes.

Only when low distortions of several parts per million or less are encountered, does distortion in the input stages of non-inverting amplifiers become significant, even with the best input circuits recommended and taught by Self. We have discovered that this distortion arises from non-linear transistor properties which are effected by input common mode voltage swings. In particular, distortion arises from modulated voltages across transistors in an input differential stage which converts a voltage differential signal to a current signal (whose amplitude is substantially linearly proportional to the said voltage differential signal). As taught above this source of distortion can be reduced by maintaining the potential difference across these transistors substantially constant. (In an inverting amplifier with a "virtual ground" differential input, this is not an issue.) In some prior art amplifiers, the voltage across the transistors in the input differential voltage to current converter is held substantially constant. In these amplifiers the effects of the distortion of the intermediate and output stage, and even the said input differential voltage to current converter would vastly exceed the small improvement produced by the maintenance of constant voltage across these transistors. There is rather another advantage of this said maintenance, namely the protection against voltage overload across these transistors if for some reason input common mode voltage is applied that falls outside the expected normal operating range.

Figure 1:
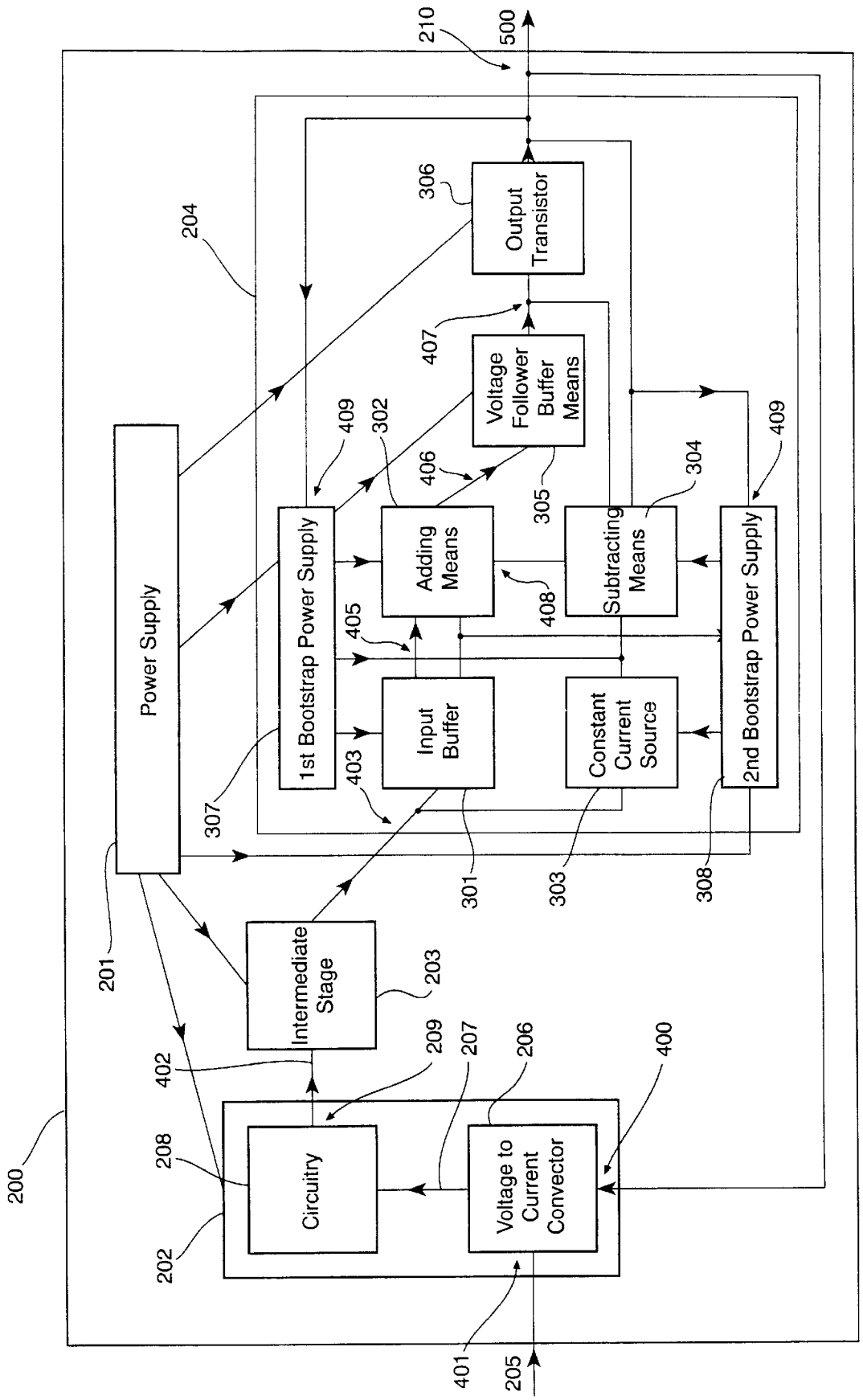
FIG. 1 is a schematic diagram in block form of the present invention.

Turning now to the figures in detail they show in FIG. 1 an amplified apparatus 200 containing a power supply 201 which supplies power to an input stage 202, an intermediate stage 203 and an output stage 204. An amplified input signal 205 is fed to an amplified input 401 in the input stage 202. The amplified input 401 is an input to a voltage to current converter 206. The voltage to current converter output 207 is fed to further circuitry 208 in the input stage 202. An output signal 209 from the input stage 202 feeds a first signal to an input 402 of the intermediate stage 203. The intermediate stage 203 feeds a second signal 403 to the output stage 204 and to an input buffer 301 and to a constant current source 303. The output of input buffer 301 feeds a buffered second signal 405 to an adding means 302. Another signal 408 is input to the adding means 302 from the output of subtracting means 304. Signal 408 is a difference signal from the subtracting means 304. The adding means provides an output sum signal 406 to the input of voltage follow buffer means 305, the voltage follower buffer means 305 supplies a buffered output sum signal 407 to the output transistor 306. These output transistors 306 provide to the amplifier output signal 500 at the amplifier output 210. The output transistor 306 receives power from supply 201. The buffered output sum signal 407 and amplifier output signal 500 are both fed to the subtracting means 304 which as a result produce the difference signal 408. The power supply 201 provides power to the first bootstrap power supply 307 whose control input 409 is connected to amplifier output 210. There may be a second bootstrap power supply 308 with a control input 409 also connected to amplifier output 210. Power to the first and second bootstrap power supplies, 307 and 308 is supplied by power supply 201. The power to input buffer 301, adding means 302, constant current source 303, subtracting means 304, and voltage follower buffer means 305 is derived from the first bootstrap power supply 307 and the second boot strap power supply 308 rather than from power supply 201 directly. The transistors in input buffer 301, adding means 302, constant current source 303, subtracting means 304, and voltage follower buffer means 305 are small signal types.

Figure 2:
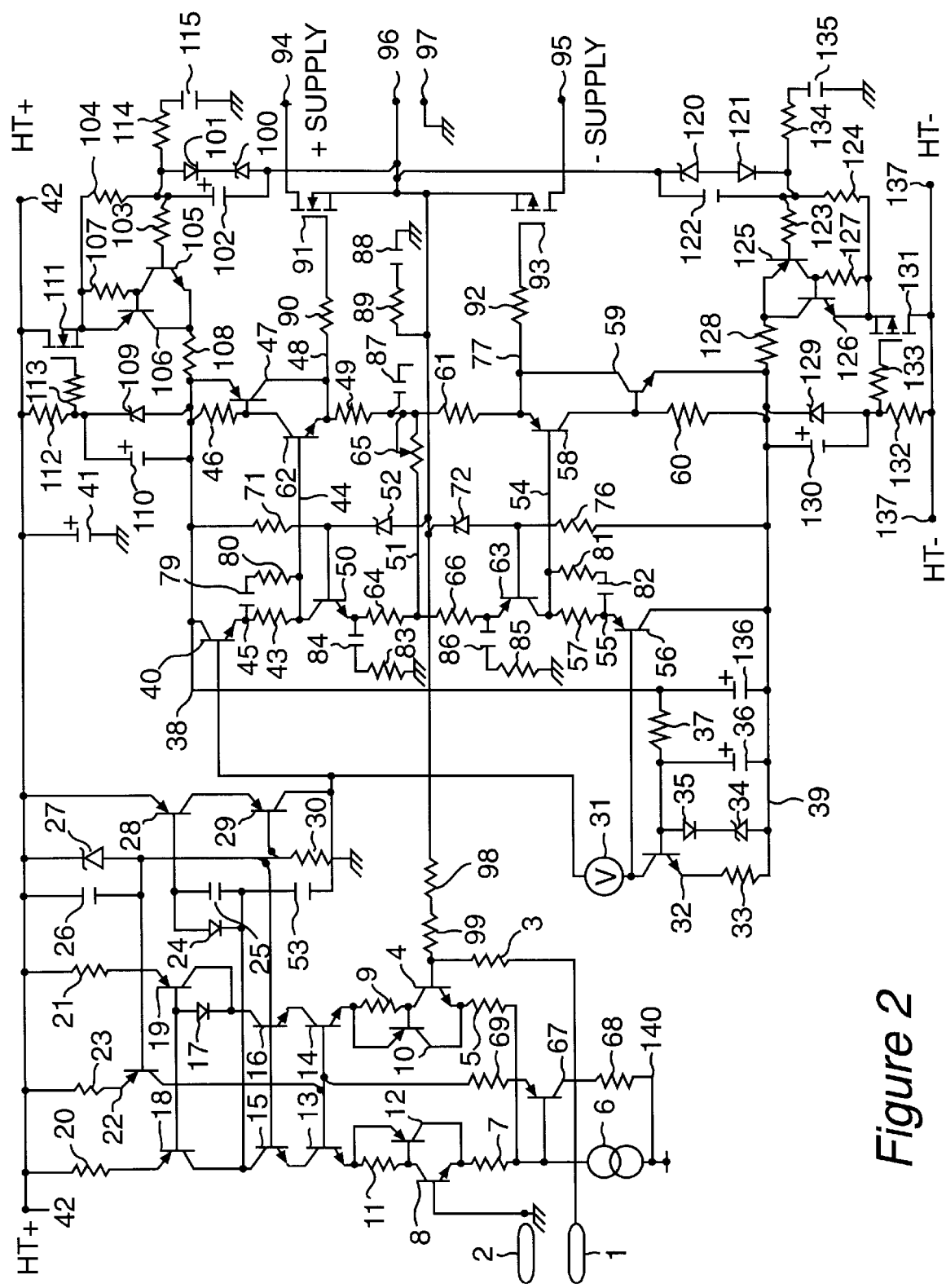
FIG. 2 is a circuit diagram of the preferred embodiment of the present invention.

The circuit diagram of the preferred embodiment is shown in FIG. 2.

In FIG. 2, the amplifier input signal is fed into terminals 1 and 2, where 2 is the amplifier ground. The amplifier input signal is then directed via resistor 3 to the inverting input of the amplifier, the base of transistor 4.

Transistors 4, 8, 10, 12, 13, 14, 15, 16, 18, 19, 22 and 67, resistors 5, 7, 9, 11, 20, 21, 23, 69 and 68, diode 17 and current source 6 form the input stage. The differential voltage to current converter is formed by transistors 4, 8, 10, 12 and resistors 5, 7, 9, and 11. The output of this first stage, the first signal, is issued from the collectors of transistors 15 and 18 to the next stage.

The emitter of transistor 4 is connected to resistor 5 and the collector of transistor 10. The collector of transistor 4 is connected to the base of transistor 10 and resistor 9. Resistor 5 is connected to resistor 7 and a constant current source 6 which is supplied from supply rail 140. The collector of transistor 8 is connected to resistor 11 and the base of transistor 12. Resistor 11 is connected to the emitter of transistor 12 and the emitter of transistor 13. Resistor 9 is connected to the emitter of transistor 10 and the emitter of transistor 14. The base of transistor 8 is connected to ground 2. The bases of transistors 13 and 14 are connected and these are also connected to resistor 69 and collector of transistor 22. This differential input voltage to current converter has highly linear transfer ratio, that is low distortion; the low distortion arising as a result of substantial local negative feedback and differential emitter resistor degeneration. Note that transistors 13 and 14 are "cascade transistors."

Resistors 5 and 7 and current source 6 are also connected to the base of transistor 67. Resistor 69 is connected to the emitter of 67 and the collector of transistor 67 is connected to resistor 68 which is connected to supply 140. The collector of 13 is connected to the emitter of transistor 15 and the collector of 14 is connected to the emitter of transistor 16. The bases of transistors 15 and 16 are connected and these are also connected to resistor 30, Zener diode 27, capacitor 26 and the base of transistor 29.

The HT+ power supply rail 42 is connected to resistors 20, 21, 23, diode 27, capacitor 26 and emitter of transistor 28. The collectors of transistors 15 and 18 are connected and these are connected to diode 24 and capacitors 25 and 53. The collectors of transistors 16 and 19 are connected and these are connected to diode 17. The bases of transistors 18 and 19 are connected and these are connected to diode 17. Resistor 69 is connected to the collector of transistor 22 and the emitter of 22 is connected to resistor 23.

For reasons previously discussed, common mode distortion is reduced if the voltage across the differential input voltage to current converter transistors is held constant, namely transistors 4, 8, 10 and 12. The voltage difference between the bases, and hence emitters, of transistors 4 and 8 is relatively small owing to large open loop gain. Hence the voltage at the node connecting resistors 5 and 7 and constant current source 6 substantially follows the common mode input voltage relative to the rails, but offset from it by an effectively constant voltage. This common mode offset voltage is fed to the base of transistor 67. The current flowing though both the resistor 69 and transistor 67 is supplied by a constant current source consisting of transistor 22 and resistor 23. Little current is diverted to the bases of transistors 13 and 14. Hence the potential difference between the emitters of transistors 4 and 8 and emitters of 13 and 14 is held substantially constant, which satisfies the requirement.

The dominant pole capacitor 53 is connected from the collector of transistor 29 to the base of 28, via the voltage dropping diode 24 and decoupling capacitor 25. The base of the cascade transistor 29 is biased to a voltage set by Zener diode 27 with paralleled capacitor 26. The Zener current is supplied via resistors 30.

The collector of 29 is connected via a constant voltage source 31, which may include heat sink temperature compensation, to a constant current source, namely the collector of transistor 32. Unlike the traditional constant current sources in this position, here this source does not incorporate a high voltage transistor, nor is it connected to the amplifier supply rail 137. Rather it consists of a small signal high gain, high frequency, low capacitance transistor 32 connected to supply node 39 which is bootstrapped to the output signal. However this could equally well be bootstrapped to the buffered second input signal which is manifest at the emitters of output stage input buffer transistors 40 and 56, namely nodes 45 and 55. The constant current source consists of transistor 32 with emitter resistor 33 and the Zener diode 34 in series with a temperature compensating diode 35, with parallel capacitor 36 decoupling 35 and 34 which set the voltage between the base of 32 and 39. The Zener diode 34 and diode 35 current is fed from resistor 37 which is supplied by another bootstrapped voltage supply node 38, also bootstrapped to the to the output. The action of bootstrapping here means that the bootstrapped voltage tracks the output signal, but is offset from it by a constant voltage offset.

The voltage at the collector of transistor 29 and transistor 32 is the second signal. The signal from the collector of 29 is buffered by an output stage input buffer, namely a voltage follower transistor 40 and the signal from the collector of 32 is buffered by an output stage input buffer, namely a voltage follower transistor 56. Both of these transistors are small signal high gain, high frequency, low capacitance transistors supplied by the said bootstrapped supply nodes, viz 38 and 39.

The emitter output of the buffer transistor 40 is connected to resistor 43.

Resistor 43 feeds node 44 which is the output of the said subtracting means, namely the collector of transistor 50 and also the node of the input to the said voltage follower buffer, namely the base of transistor 62. Note too that 44 is also the output sum signal.

The collector of the current source transistor 32 is connected to the base of a buffer voltage follower transistor 56 which has it's collector supplied by the second bootstrapped voltage source supply at node 39. The emitter output of the buffer transistor 56 is connected to resistor 57. Resistor 57 feeds node 54 which is the output of the said subtracting means, namely the collector of transistor 63 and also the node of the input to the said voltage follower buffer, namely the base of transistor 58. Note too that 54 is also the output sum signal. There is a constant voltage between 44 and 54. The sum and difference signal refer to a.c. signals The current from collectors of 50 and 63 should be only responsive to the non-linear error component signal. This current signal is manifested as a voltage drop across resistor 43 and also 57.

The collector of transistor 62 (npn) is connected to the positive bootstrapped voltage source via resistor 46. The collector is also connected to the base of transistor 47 (pnp) whose collector in turn is connected to the emitter of transistor 62. The emitter of transistor 47 is also connected to the positive bootstrapped voltage source node 38. Transistors 62 and 47 form a voltage follower buffer with a high level of local negative feedback which results in a high input impedance, low output impedance, low distortion, and a transfer function relatively independent of output current or output load. Hence the voltage at the emitter of 62 faithfully reproduces the voltage at it's base, except for a voltage offset. This is the buffered output sum signal, that is at nodes 48 (bar a d.c. offset). Similarly transistors 58, 59 and resistors 60 also form an identical complementary buffer and so the node 77 also is the buffered output sum signal (bar a d.c. offset).

48 feeds the gate of the output transistor 91 gate via a resistor 90, and 77 feeds the gate of the output transistor 93 gate via a resistor 92. These resistors may be necessary to quench possible high frequency oscillations.

The emitter of transistor 62 is connected to resistor 49 which is also connected to resistor 61 and variable resistor 65. Resistor 65 is connected to resistor 66 and 64. 64 is connected to the emitter of transistor 50. The base of transistor 50 is connected to reference diode 52 and resistor 71 which is connected to node 38.

The emitter of transistor 58 is connected to resistor 61. Resistor 66 is connected to the emitter of transistor 63. The base of transistor 63 is connected to reference diode 72 and resistor 76 which is connected to node 39. The diodes 52 and 72 are connected to the amplifier output 96.

Barring constant voltage offsets, the output signal of the amplifier at 96 appears at the bases of transistors 50 and 63. Transistors 50 and 63 are wired up as subtracter circuits, where the amplifier output signal is subtracted from the signal at nodes 48 and 77.

This subtraction signal is manifest as transistor 50 and 63 collector currents of opposite sign senses. That is if the current in 50 increases then that in 63 decreases by the same amount. These currents are then added to the second signal for reasons given above. Hence ideally, the second signal equals the output signal and the non linear error component signal generated in the output transistors does not appear at the output.

For the circuit action to perform accurately the value of resistor 49 plus 2 times that of 65 plus the effective resistance of 64 must equal that of the effective resistor 43, taking the effective series transistor associated resistances into account. This assumes resistor 49 substantially equals 61 and resistor 64 substantially equals 66 and resistor 43 substantially equals 57. In practice the variable resistor 65 is adjusted to fine set the error correction by adjustment to minimise harmonic distortion.

Transistor 91 is supplied by a power supply connected to 94 and ground 97, and transistor 93 is supplied by a power supply connected to 95 and ground. The sources of both 91 and 93 feed the output 96. The generation of the said non-linear error component signal occurs in the output transistors 91 and 93.

It is important that the voltage between the gates of transistors 91 and 93 is independent of the PCB temperature, but dependent on the temperature of transistors 91 and 93 so that the quiescent current through transistors 91 and 93 is independent of both the temperature of the PCB and 91 and 93. The temperature tracking of 91 and 93 can occur through elements in 31 in any well known appropriate circuit arrangement. It can be shown mathematically that if resistor 64 plus resistor 66 equals double resistor 43 plus double resistor 57, then assuming transistors 40, 56, 50, 63, 62 and 58 are at the same temperature (PCB temperature) then the voltage difference between 48 and 77 will be approximately temperature independent of the PCB temperature but dependent on the temperature of 91 and 93.

Zener diode 100 is connected to diode 101. Across these diodes is a decoupling capacitor 102. Diode 101 and capacitor 102 are connected to resistors 103 and 104. Resistor 103 is connected to the base of transistor 105. The collector of 105 is connected to resistor 107 and the base of transistor 106. The emitter of 106 is connected to resistors 107 and 104 and to the source of transistor 111. The emitter of transistor 105 is connected to the collector of 106 and to resistor 108. Resistor 108 is connected to the positive bootstrapped supply node 38. Zener diode 109 is connected to resistors 113 and 112. Decoupling and storage capacitor 110 is connected across 109. The gate of transistor 111 is connected to resistor 113 and the collector of 111 is connected to the HT+ supply 42 and resistor 112 and decoupling capacitor 41 which is connected to ground 97. 97 is connected to 2.

Zener diode 120 is connected to diode 121. Across these diodes is a decoupling capacitor 122. Diode 121 and capacitor 122 are connected to resistors 123 and 124. Resistor 123 is connected to the base of transistor 125. The collector of 125 is connected to resistor 127 and the base of transistor 126. The emitter of 126 is connected to resistors 127 and 124 and to the source of transistor 131. The emitter of transistor 125 is connected to the collector of 126 and to resistor 128. Resistor 128 is connected to the negative bootstrapped supply node 39. Zener diode 129 is connected to resistors 133 and 132. Decoupling and storage capacitor 130 is connected across 129. The gate of transistor 131 is connected to resistor 133 and the collector of 131 is connected to the HT-supply 137 and resistor 132.

Note that these bootstrapped supplies form a "cascaded" bootstrapped supply. The transistors 105, 106, 125 and 126 are small transistor types with substantial local negative feedback and produce a bootstrapped voltage which follows the output signal with relatively little distortion. On the other hand substantial voltage variation occurs across power transistors 111 and 131 and the sources of these produce relatively high distortion, but this does not effect the integrity of the buffers, adder or subtracter because of the isolation of the transistor 105, 106 and 125, 126 bootstrapped supply which would otherwise occur. Storage capacitor 136 maintains a constant voltage between 38 and 39.

Overall negative feedback is formed via series resistors 98 and 99 connected from the output 96 back to the amplifier inverting input.

A series resistor 80 capacitor 79 network is connected across resistor 43 to quench possible high frequency oscillations. For the same reasons a series resistor 81 capacitor 82 network is connected across resistor 57, and a series resistor 83 capacitor 84 network is connected between the emitter of transistor 50 and ground 97, and a series resistor 85 capacitor 86 network is connected between the emitter of transistor 63 and ground 97. Also a capacitor 87 is connected between ground and the node connecting resistors 49, 61 and 65. A series resistor 114 and capacitor 115 and resistor 134 and capacitor 135 may be necessary to quench high frequency oscillation in the bootstrapped power supplies. Note there are many possible arrangements to achieve the low distortions using the inventive steps described herein. For example, it is not essential to have a symmetrical arrangement of input buffers, adders, subtracters and output buffers as shown in FIG. 2. One of each would suffice with appropriate biasing.

The low distortion achievable with this circuit lies in several areas, namely the use of the error corrected amplification output stage means containing only small signal high gain, high frequency, low capacitance transistors in the adding means and subtracting means stages, as well as voltage follower buffers, output stage input buffers and the said constant current source. This is made possible with the supplies to these stages being of relatively low voltage potential difference which are bootstrapped to the output signal (or second input buffered signal). In addition the use of a low distortion high input impedance, low output impedance, low distortion voltage follower buffers feeding the output transistors where the transfer function of these buffers are relatively load independent, assists substantially in reducing distortion by their precise action. Furthermore, in a practical amplifier thermal independent operation of the output stage quiescent current should be ensured. In non-inverting arrangement, voltage modulation across the common mode input differential voltage to current converter transistors should be avoided by cascade transistors bootstrapped to the common mode voltage.

I claim:

1. An electronic amplifier apparatus comprising an input stage, to which an amplifier input signal is applied and which is adapted to amplify the amplifier input signal and to provide a first signal to an intermediate stage adapted to amplify the said first signal and further adapted to provide a second signal to an output stage adapted to amplify the said second signal and further adapted to provide an amplifier output signal to an amplifier output, and a power supply means adapted to provide power to the input stages the intermediate stage and the output stage, wherein:

the output stage includes output transistors connected so as to provide the amplifier output signal and further includes an error correction means comprising an input buffer means, an adding means, a subtracting means and a voltage follower buffer means wherein, the input buffer means adapted to receive the second signal and connected to the adding means, the said adding means is adapted to sum the second signal with a difference signal to produce an output sum signal, the said voltage follower buffer means is adapted to provide a buffered output sum signal when fed the output sum signal, the buffered output sum signal is fed to inputs of the output transistors and to the subtracting means, the amplifier output signal is fed to the subtracting means which is adapted to subtract the amplifier output signal from the buffered output sum signal to produce the difference signal, and a first bootstrapped power supply is adapted to provide power to the error correction means, the first bootstrapped power supply further adapted to closely track the output signal by means of bootstrapping.

2. An electronic amplifier apparatus as in claim 1 wherein all transistors in the error correction means are small signal transistors.

3. An electronic amplifier apparatus as in either of claims 1 or 2 in which the second signal is also fed to a constant current source whose power is supplied by the said first bootstrapped power supply means which is further adapted to provide power to the constant current source, the constant current source containing a constant current supply transistor which is a small signal transistor.

4. An electronic amplifier apparatus as in claims 1 or 2 wherein the bootstrapped power supply means has little distortion and has local negative feedback.

5. An electronic amplifier apparatus as in claims 1 or 2 wherein the output buffered sum signal is substantially independent of temperature.

6. An electronic amplifier apparatus as in any claims 1 or 2 in which the said voltage follower buffer has substantially high input impedance, low output impedance, low distortion and negative feedback localised to the said voltage follower buffer.

7. An electronic amplifier apparatus as in claim 4 in which the said voltage follower buffer has substantially high input impedance, low output impedance, low distortion and negative feedback localised to the said voltage follower buffer.

8. An electronic amplifier apparatus as in any one of claims 1 or 2 wherein the input stage contains a first input differential stage adapted to convert a voltage differential signal to a current signal whose amplitude is substantially linearly proportional to the said voltage differential signal, the first differential input stage containing transistors across which a potential difference is held substantially constant.

9. An electronic amplifier apparatus as in claim 4 wherein the input stage contains a first input differential stage adapted to convert a voltage differential signal to a current signal whose amplitude is substantially linearly proportional to the said voltage differential signal, the first differential input stage containing transistors across which said potential difference is held substantially constant.

10. An electronic amplifier apparatus as claim 5 wherein the input stage contains a first input differential stage adapted to convert a voltage differential signal to a current signal whose amplitude is substantially linearly proportional to the said voltage differential signal, the first differential input stage containing transistors across which said potential difference is held substantially constant.

11. A method of electronic amplification including applying an amplifier input signal to an amplifier input stage to amplify the amplifier input signal and provide a first signal, amplifying said first signal by an intermediate stage and providing a second signal, amplifying said second signal by an output stage that provides an amplifier output signal to an amplifier output, the stages provided power by a power supply means;

the output stage containing output transistors which provide the amplifier output signal and also containing an error correction means consisting of an input buffer means, an adding means, a subtracting means and a voltage follower buffer means, the input buffer means adapted to receive the second signal and connected to the adding means;

and further including the steps of:

summing in the adding means the buffered second signal with a difference signal to produce an output sum signal, feeding the voltage follower buffer means with the output sum signal to provide a buffered output sum signal, feeding the buffered output sum signal to inputs of the output transistors and to the subtracting means, feeding the amplifier output signal to the subtracting means which subtracts the amplifier output signal from the buffered output sum signal to produce the difference signal, and supplying power to the error correction means by a first bootstrapped power supply which closely tracks the output signal by means of bootstrapping.

12. A method of electronic amplification as in claim 11 wherein all transistors in the error correction means are small signal transistors.

13. A method of electronic amplification as in either of claims 11 or 12 further including feeding the second signal to a constant current source whose power is supplied by the said first bootstrapped power supply means and which contains a constant current supply transistor which is a small signal transistor.

14. A method of electronic amplification as in claims 11 or 12 wherein the bootstrapped power supply means has little distortion and has local negative feedback.

15. A method of electronic amplification as in claims 11 or 12 wherein the output buffered sum signal is substantially independent of temperature.

16. A method of electronic amplification as in claims 11 or 12 in which the said voltage follower buffer has substantially high input impedance, low output impedance, low distortion and negative feedback localised to the said voltage follower buffer.

17. A method of electronic amplification as in claim 14 in which the said voltage follower buffer has substantially high input impedance, low output impedance, low distortion and negative feedback localised to the said voltage follower buffer.

18. A method of electronic amplification as in claims 11 or 12 wherein the input stage contains a first input differential stage which converts a voltage differential signal to a current signal whose amplitude is substantially linearly proportional to the said voltage differential signal, the first differential input stage containing transistors across which a potential difference is held substantially constant.

19. A method of electronic amplification as in claim 14 wherein the input stage contains a first input differential stage which converts a voltage differential signal to a current signal whose amplitude is substantially linearly proportional to the said voltage differential signal, the first differential input stage containing transistors across which a potential difference is held substantially constant.

20. A method of electronic amplification as in claim 16 wherein the input stage contains a first input differential stage which converts a voltage differential signal to a current signal whose amplitude is substantially linearly proportional to the said voltage differential signal, the first differential input stage containing transistors across which a potential difference is held substantially constant.

* * * * *

UNITED STATES PATENT AND TRADEMARK OFFICE
CERTIFICATE OF CORRECTION

PATENT NO. : 5,892,398
DATED : April 6, 1999
INVENTOR(S) : Bruce Halcro Candy

It is certified that error appears in the above-identified patent and that said Letters Patent is hereby corrected as shown below:

<u>Title page,</u>
Item [22], "PCT filed: July 13, 1996" should read -- PCT filed: July 13, 1995 --.

Signed and Sealed this

Seventeenth Day of September, 2002

Attest:

Attesting Officer

JAMES E. ROGAN
*Director of the United States Patent and Trademark Office*